United States Patent [19]

Ohya et al.

[11] Patent Number: 4,843,609
[45] Date of Patent: Jun. 27, 1989

[54] OPTICAL INTEGRATED CIRCUIT FOR HETERODYNE DETECTION

[75] Inventors: Jun Ohya, Osaka; Yasushi Matsui, Suita, both of Japan

[73] Assignee: Matsushita Electric Industrial Co., Ltd., Osaka, Japan

[21] Appl. No.: 138,086

[22] Filed: Dec. 28, 1987

[30] Foreign Application Priority Data

Dec. 26, 1986 [JP] Japan .................................. 61-312007

[51] Int. Cl.[4] .............................................. H01S 3/098
[52] U.S. Cl. .......................................... 372/18; 372/50; 372/92
[58] Field of Search ................... 372/9, 18, 32, 43, 50, 372/6, 92, 96, 98, 102, 108; 350/96.14, 96.15, 96.19

[56] References Cited

U.S. PATENT DOCUMENTS

| 4,515,431 | 5/1985 | Shaw et al. | 372/6 |
| 4,674,830 | 6/1987 | Shaw et al. | 372/6 |
| 4,720,160 | 1/1988 | Hicks, Jr. | 372/6 |
| 4,723,824 | 2/1988 | Shaw et al. | 372/6 |

FOREIGN PATENT DOCUMENTS

| 0227180 | 12/1984 | Japan | 372/50 |
| 0180184 | 9/1985 | Japan | 372/32 |

OTHER PUBLICATIONS

Optical FM Signal Amplification by Injection Locked and Resonant Type Semiconductor Laser Amplifiers By: Soichi Kobayashi, member IEEE, and Tatsuya Kimura, senior member, IEEE, IEEE Journal of Quantum Electronics, vol. QE-18, No. 4, Apr. 1982.

Integrated-Optic, Narrow-Linewidth Laser, By: S. K. Korotky, E. A. J. Marcatili, G. Eisenstein, J. J. Veselka, F. Heismann, and R. C. Alferness, Appl. Phys. Lett. 49(1), 7 Jul. 1986.

Narrow Spectral Linewidth Characteristics of Monolithic Integrated-Passive-Cavity InGaAsP/InP Semiconductor Lasers, Electronics Letters, 25th Apr. 1985, vol. 21, No. 9, pp. 374-376.

Primary Examiner—William L. Sikes
Assistant Examiner—B. R. R. Holloway
Attorney, Agent, or Firm—Wenderoth, Lind & Ponack

[57] ABSTRACT

Disclosed is an optical integrated circuit for heterodyne detection. The optical integrated circuit comprises: a semiconductor substrate; an active region of a semiconductor laser; two optical waveguides; a photo detector; and an optical coupler composed of the waveguides. The emission of light from the active region of the semiconductor laser is synthesized as local oscillation light with the transmission light. The synthesized light travels through the optical coupler and is detected by the photo detector.

5 Claims, 1 Drawing Sheet

OPTICAL INTEGRATED CIRCUIT FOR HETERODYNE DETECTION

BACKGROUND OF THE INVENTION

This invention relates to an optical integrated circuit for heterodyne detection which can be used in coherent optical communications, optically applied measurements, etc.

The modulation and demodulation system of optical communications depends, at present, mainly on direct modulation and direct detection. There is, however, a great demand for a larger information transmission capacity and an extension in the distance between repeater intervals. As such, the realization of coherent optical communications is expected. In coherent optical communications, the transmitted light signal is received by heterodyne or homodyne detection at the receiving end. The structure of the optical heterodyne or homodyne receiver is shown in FIG. 1. A light signal 1 is synthesized with a local oscillation light 3 emitted from a local oscillator 2 at a beam splitter 4, and is detected by a photo detector 5. Numeral 6 denotes an automatic frequency control system or loop filter. In heterodyne detection, in order to keep the intermediate frequency at a constant value, or in homodyne detection, in order to synthesize the phase of the local oscillation light with the phase of light signal, the local oscillator 2 is controlled by a detection signal 7.

In this system, when a local oscillator with sufficiently large power is used at the receiving end, a reception sensitivity at shot noise limit may be obtained, and a sensitivity improvement of 10 to 30 dB may be expected as compared with the direct detection system.

To realize the coherent optical communications, however, there are many technical problems to be solved. In particular, the improvement of the spectral linewidth of the semiconductor laser is an important issue.

The spectral linewidth can be improved by composing the semiconductor laser in an external cavity structure as reported by Wyatt, R. et al. in Electron. Lett. 19, pp. 110–112, 1983, but it tends to be mechanically unstable in the case of hybrid composition. However, as we reported in Electron. Lett. 21, pp. 374≧376, a stable narrow spectral linewidth is obtained when the external cavity is integrated monolithically.

Since the receiver shown in FIG. 1 is not monolithic, the entire apparatus is very large in size.

SUMMARY OF THE INVENTION

It is hence a primary object of this invention to present an optical integrated circuit for heterodyne detection in a monolithic constitution which is capable of obtaining local oscillation light of narrow spectral linewidth by integrating an external cavity semiconductor laser as the local oscillator, an optical coupler and a photo detector on a same substrate.

This and other objects are accomplished by an optical integrated circuit for heterodyne detection which comprises; an active region of semiconductor laser containing at least one active layer and at least one cladding layer partially formed on a semiconductor substrate; a first optical waveguide capable of guiding the light emitted from the active region, formed adjacently to the active region; a second optical waveguide capable of guiding a light signal entering from one end; and a photo detector located at one end of either the first or second optical waveguide, whereby a cavity of semiconductor laser is formed having a high reflectivity at one end at of the active region and one end of the other optical waveguide not possessing said photo detector; and a 2×2 optical coupler is formed so as to allow the first and second optical waveguides to vary the coupling ratio, wherein the emission light of the semiconductor layer is synthesized as local oscillation light with the signal light through the 2×2 optical coupler so as to detect the light by the photo detector.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
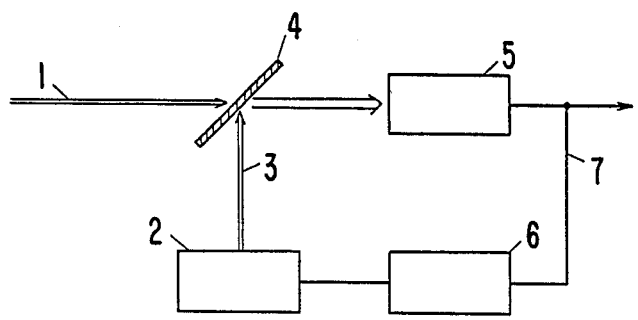
FIG. 1 is a block diagram of a conventional heterodyne homodyne receiver.
Figure 2:
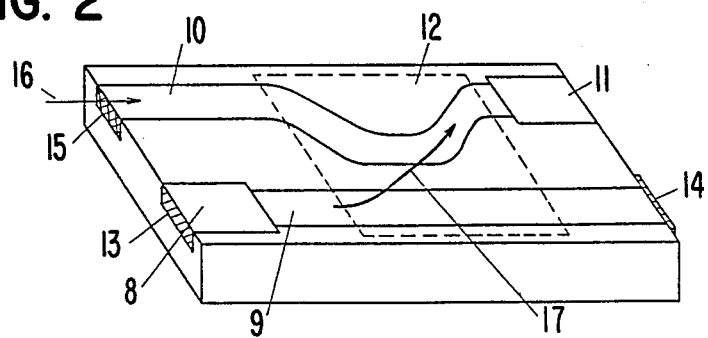
FIG. 2 is a schematic perspective view of an optical integrated circuit for heterodyne detection in a first embodiment of this invention.

Referring now to FIG. 2 which shows a schematic perspective view of an optical integrated circuit for heterodyne detection composing an embodiment of this invention: 8 is an active region of an external cavity type semiconductor laser; 9 is an optical waveguide functioning as an external cavity; 10 is an optical waveguide; and 11 is a photo detector, wherein a directional coupler is composed of the optical waveguides 9 and 10 in a region 12 indicated by the broken line, and end faces 13 and 14 are coated with reflection coating to make up the laser cavity, while an end face 15 is coated with anti-reflection coating to form an input end of signal light 16.

The oscillation light 17 of the external cavity type semiconductor laser is synthesized, as a local oscillation light, with signal light 16 in the directional coupler 12, and is detected in the photo detector 11 by heterodyne detection.

Since the external cavity type semiconductor laser uses a considerably longer optical waveguide than the active region length as external cavity, phase fluctuation due to spontaneous emission and resonance frequency fluctuation due to carrier density changes in the active region are lessened, and single longitudinal mode oscillation at a spectral linewidth of 1 MHz or less is effected. As a result, a stable demodulation signal is obtained even if the signal light is a PSK modulation signal.

Figure 3:
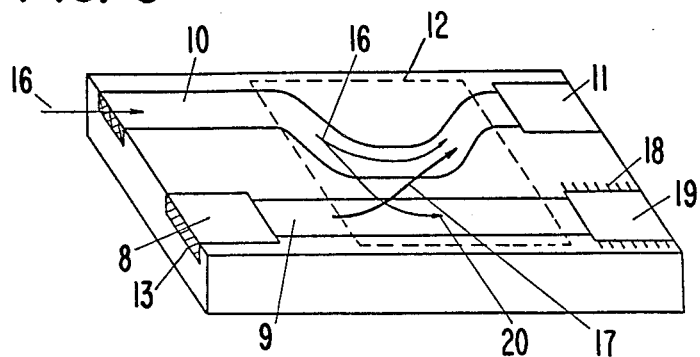
FIG. 3 is a schematic perspective view of an optical integrated circuit for heterodyne detection in a second embodiment of this invention.

FIG. 3 shows a schematic perspective view of an optical integrated circuit for heterodyne detection composing a second embodiment of this invention. In FIG. 3, numeral 18 is a grating; 19 is a control electrode; and a laser cavity is composed of an end face 13 and the grating 18. The other components are identical with those in the first embodiment. The light emission from the active region 8 is guided in the optical waveguide 9. Light of specific wavelength corresponding to the grating pitch selected by the grating 18 is reflected to the active region 8 side to resonate, and laser oscillation is effected at this wavelength. The wavelength of this laser oscillation is variable by injecting carrier from the control electrode 19 and effectively varying the grating pitch.

In the second embodiment, by controlling the current into the control electrode 19 so that the heterodyne-detected intermediate frequency might be constant, the fluctuation of intermediate frequency can be suppressed to 1/50.

In the constitution of the second embodiment, by setting the wavelength of local oscillation light 17 within the injection locking range of signal light 16 by current injection into the control electrode 19, a part 20 of signal light 16 is injected into the external cavity of the semiconductor laser, and injection locking is applied. The local oscillation light 17 obtained by injection locking preserves the interference of signal light 16, so that a stable homodyne detection output can be obtained. The injection locking technique is specifically reported by Kobayashi, S. et al., in IEEE J. Quantum Electron., QE-18, pp. 575-581.

Furthermore, by modulating the current into the active region at a desired intermediate frequency and synchronously injecting the signal light 16 into its side band, the intermediate frequency can be always kept constant. As a result, the wavelength control system of the local oscillation light 17 is simplified, and the receiver is reduced in size.

In this embodiment, meanwhile, a directional coupler is used as a 2×2 optical coupler, and the coupling length is set so that coupling ratio may be nearly 1:1. It may be also possible to compose an optical coupler by using an internal total reflection type or bipolar type photo switch or the like and setting the voltage so as to obtain a desired coupling ratio.

This invention, as described herein, presents an optical integrated circuit for stable heterodyne detection having a small size and a narrow spectral linewidth of local oscillation light, by integrating an external cavity type semiconductor laser as a local oscillator, an optical coupler and a photo detector on a same substrate, which is very effective as a receiver in coherent optical communications or optical sensor.

Incidentally, a hybrid extended cavity laser consisting of an InGaAsP gain medeum and an optical circuit with a parallel coupled cavity, electro-optic elements and an external phase modulator integrated on a substrate of $LiNbO_3$ was reported by S. K. Korotky et al., in Appl. Phys. Lett. 49, pp. 10–12. However, this is a transmitter for coherent optical communications, and is different in nature from this invention, and since the semiconductor laser is not integrated monolithically, optical axis matching is difficult, and the operation is unstable in a long range.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:

1. An optical integrated circuit for heterodyne detection, comprising:
   a semiconductor substrate having a planar surface, a first end, and a second end opposite said first end;
   an active region of a semiconductor laser, containing at least one active layer and at least one cladding layer, formed on said planar surface at said first end;
   a first optical waveguide formed on said planar surface coupled to said active region and extending to said second end, wherein said first optical waveguide guides emission of light from said active region;
   a second optical waveguide formed on said planar surface extending from said first end to said second end, wherein said second optical waveguide guides light entering said first end;
   a photodetector formed on said planar surface at said second end and coupled to one of said first and second optical waveguides, wherein a laser cavity extends from said active region to the other of said first and second optical waveguides at said second end;
   a 2×2 optical coupler composed of portions of said first and second optical waveguides,
   whereby said emission of light from said active region is synthesized as local oscillation light with said light entering said first end, and is conveyed through said 2×2 optical coupler, and is detected by said photodetector.

2. An optical integrated circuit for heterodyne detection according to claim 1, further comprising:
   a grating region formed on said planar surface at said second end and coupled to said laser cavity, said grating region having a control electrode for varying wavelength of reflected light,
   wherein said grating region reflects said emission of light from said active region at a selected wavelength.

3. An optical integrated circuit for heterodyne detection according to claim 1, wherein said 2×2 coupler is arranged such that
   said emission of light from said active region is synchronously injection-locked by said light entering said first end through said 2×2 optical coupler for homodyne detection.

4. An optical integrated circuit according to claim 1, wherein said 2×2 coupler is arranged such that
   said emission of light from said active region is modulated at a frequency corresponding to an intermediate frequency, and is synchronously injection-locked into a side band by said light entering said first end through said 2×2 optical coupler.

5. An optical integrated circuit for heterodyne detection, comprising:
   a semiconductor substrate having a planar surface, a first end, and a second end opposite said first end;
   an active region of a semiconductor laser, containing at least one active layer and at least one cladding layer, formed on said planar surface at said first end;
   a first optical waveguide formed on said planar surface coupled to said active region and extending to said second end, wherein said first optical waveguide guides emission of light from said active region;
   a second optical waveguide formed on said planar surface extending from said first end to said second end, wherein said second optical waveguide guides light entering said first end;
   a photodetector formed on said planar surface at said second end and coupled to one of said first and second optical waveguides, wherein a laser cavity extends from said active region to the other of said first and second optical waveguides at said second end;

an optical coupler composed of portions of said first and second optical waveguides, whereby said emission of light from said active region is synthesized as local oscillation light with said light entering said first end, and is conveyed through said optical coupler, and is detected by said photodetector.

* * * * *